(12) United States Patent
Onaran et al.

(10) Patent No.: US 12,030,021 B2
(45) Date of Patent: Jul. 9, 2024

(54) MICROMECHANICAL DEVICE WITH PERFORATED MEMBRANE

(71) Applicant: Infineon Technologies AG, Neubiberg (DE)

(72) Inventors: Abidin Güçlü Onaran, Munich (DE); David Tumpold, Kirchheim b München (DE)

(73) Assignee: Infineon Technologies AG, Neubiberg (DE)

( * ) Notice: Subject to any disclaimer, the term of this patent is extended or adjusted under 35 U.S.C. 154(b) by 742 days.

(21) Appl. No.: 17/144,978

(22) Filed: Jan. 8, 2021

(65) Prior Publication Data

US 2021/0220778 A1   Jul. 22, 2021

(30) Foreign Application Priority Data

Jan. 20, 2020   (EP) .................................. 20152726

(51) Int. Cl.
*G01N 29/22*   (2006.01)
*B01D 69/10*   (2006.01)
(Continued)

(52) U.S. Cl.
CPC ............ *B01D 69/10* (2013.01); *B81B 7/0038* (2013.01); *B81C 1/00285* (2013.01);
(Continued)

(58) Field of Classification Search
CPC .............. B01D 69/10; B01D 2325/028; B01D 2325/04; B01D 2325/24; B81B 7/0038; B81B 2201/0257; B81B 7/02; B81B 3/007; B81B 2201/0292; B81B 2203/0127; B81C 1/00285; B81C 2201/0161; G01N 21/1702; G01N 2021/1704; G01N 29/222;
(Continued)

(56) References Cited

U.S. PATENT DOCUMENTS 10,935,451 B2 *   3/2021   Tumpold ................ G01L 19/04
11,197,103 B2 *  12/2021   Piechocinski ......... B81B 7/0058
(Continued)

FOREIGN PATENT DOCUMENTS

EP   1764146 A2   3/2007
WO   9924141 A1   5/1999
WO   0167072 A1   9/2001

OTHER PUBLICATIONS

Feiertag, Gregor et al., "Flip chip packaging for MEMS microphones", Microsystem Technologies; Micro- and Nanosystems Information Storage and Processing Systems, Springer, Berlin, DE, vol. 16, No. 5, XP019804471, Feb. 6, 2010, pp. 817-823.

*Primary Examiner* — Suman K Nath
(74) *Attorney, Agent, or Firm* — Slater Matsil, LLP

(57) ABSTRACT

The present disclosure concerns a micromechanical device and a method for manufacturing the same. The micromechanical device may comprise a membrane structure suspended on a substrate. The membrane structure may comprise a perforated gas permeable membrane comprising a plurality of perforations, and a reinforcement structure being coupled with the perforated membrane for stiffening the perforated membrane and/or for increasing the mechanical stability of the perforated membrane in order to attenuate an oscillation of the perforated membrane.

20 Claims, 10 Drawing Sheets

(51) Int. Cl.
*B81B 7/00* (2006.01)
*B81C 1/00* (2006.01)
*G01N 21/17* (2006.01)
*H04R 7/02* (2006.01)
*H04R 9/08* (2006.01)

(52) U.S. Cl.
CPC ........... *G01N 21/1702* (2013.01); *H04R 7/02* (2013.01); *H04R 9/08* (2013.01); *B01D 2325/028* (2013.01); *B01D 2325/04* (2013.01); *B01D 2325/24* (2013.01); *B81B 2201/0257* (2013.01); *G01N 2021/1704* (2013.01); *G01N 29/222* (2013.01); *H04R 2201/003* (2013.01); *H04R 2201/025* (2013.01)

(58) Field of Classification Search
CPC .. G01N 29/2418; G01N 29/32; G01N 29/022; G01N 21/3504; H04R 7/02; H04R 9/08; H04R 2201/003; H04R 2201/025
See application file for complete search history.

(56) References Cited

U.S. PATENT DOCUMENTS

| | | | |
|---|---|---|---|
| 2001/0019029 A1* | 9/2001 | Tai | B01D 67/0062 216/2 |
| 2007/0039471 A1 | 2/2007 | Hofmann | |
| 2009/0029142 A1* | 1/2009 | Jacobson | B26F 1/31 216/48 |
| 2013/0122539 A1 | 5/2013 | Li et al. | |
| 2017/0325013 A1 | 11/2017 | Dehe et al. | |
| 2020/0087138 A1* | 3/2020 | Schenk | B81B 3/0021 |

* cited by examiner

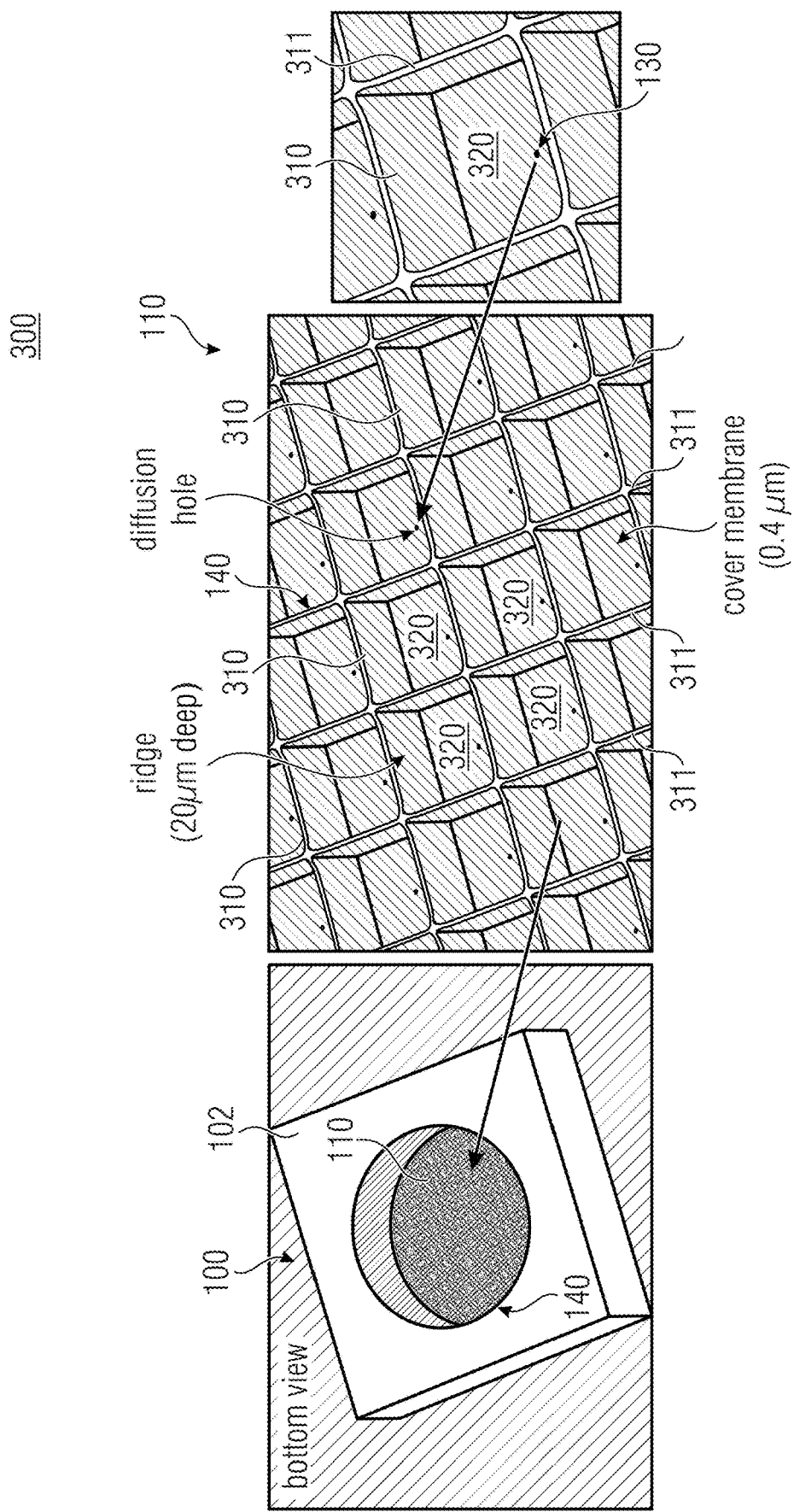

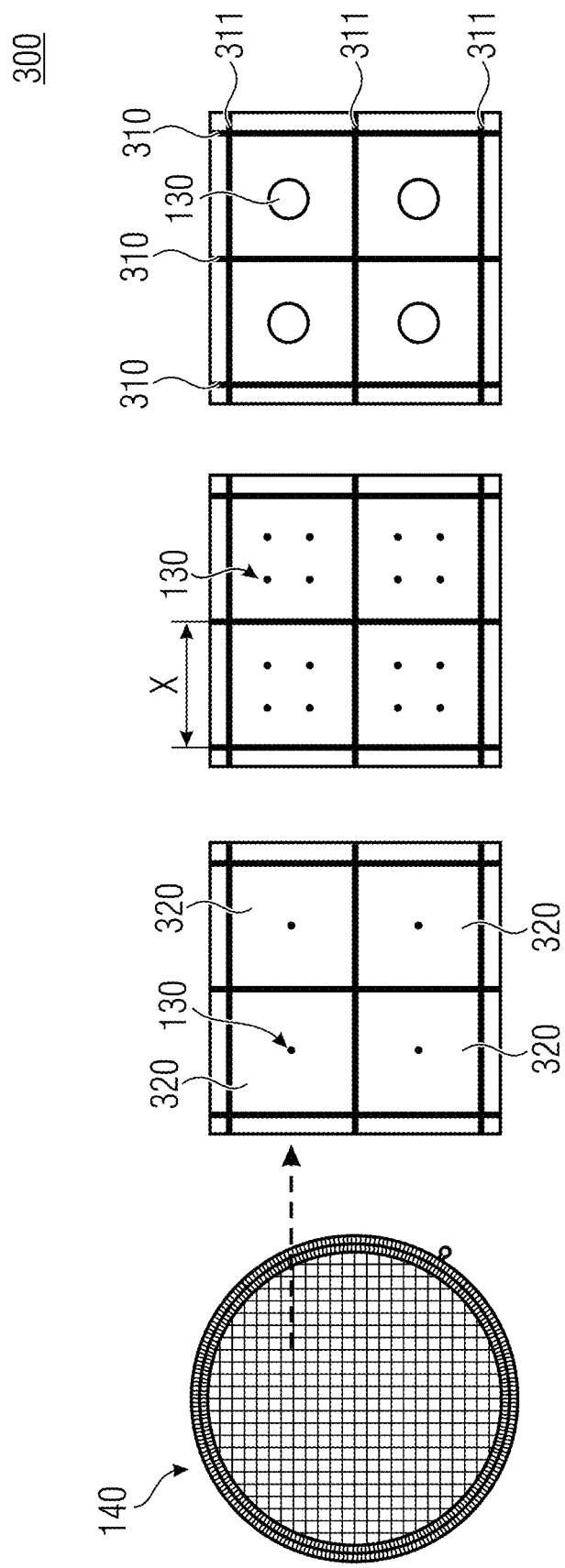

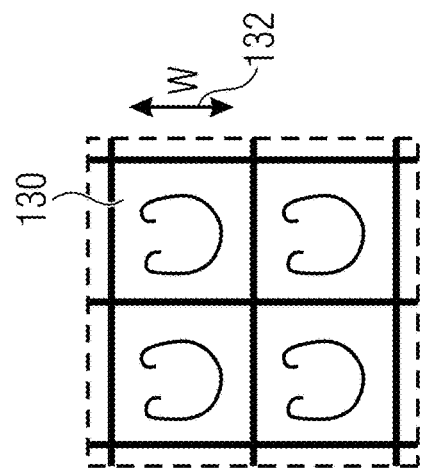
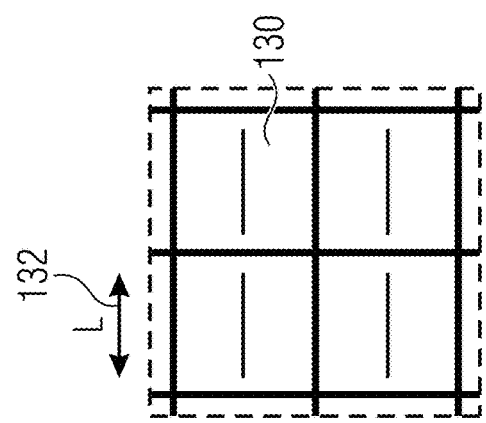
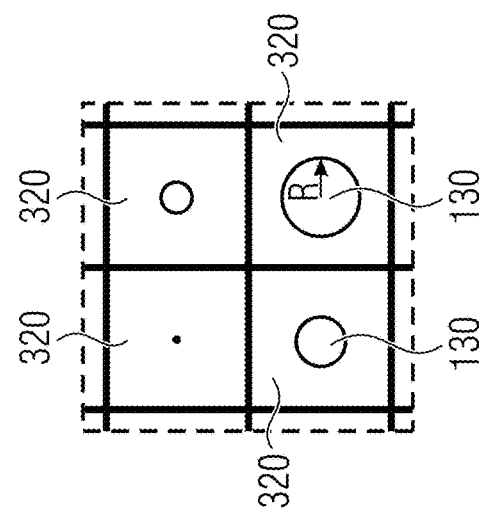

MICROMECHANICAL DEVICE WITH PERFORATED MEMBRANE

This application claims the benefit of European Application No. 20152726.4, filed on Jan. 20, 2020, which application is hereby incorporated herein by reference.

TECHNICAL FIELD

Embodiments of the present disclosure relate to a micromechanical device to be used in a gas sensor, the micromechanical device comprising a perforated membrane. The perforated membrane may be permeable to fluids, e.g. gases. In some particular embodiments, the micromechanical device may further comprise a reinforcement structure for stiffening the membrane such that the perforated membrane may attenuate acoustic waves at certain frequencies.

BACKGROUND

Sensing of environmental parameters, such as noise, sound, temperature and gases gains more and more importance within mobile devices, home automation and the automotive sector. Harmful gas concentrations can occur due to pollution and malfunction of certain devices. The well-being is strongly influenced by the air quality. Gas detection by cheap, always available and connected sensors is an upcoming topic in the future.

Conventional gas sensors, which are based on NDIR technique, usually use meshes for particle protection and gas diffusion. Other known gas sensors can be based on photoacoustic spectroscopy. In so-called "closed" photoacoustic spectroscopy gas sensors, there are two chambers, one open to the atmosphere and one not. The light first propagates through the chamber that is open to the atmosphere, where it gets absorbed by the target gas. The remaining light is then measured in the closed cavity by using the photoacoustic principle. In contrast, so-called "open" photoacoustic spectroscopy (PAS) gas sensors use a single cavity, which may be separated from the atmosphere by a mesh or membrane. Open PAS system concepts can suffer from crosstalk with respect to environmental acoustics.

For example, meshes may be suitable for preventing particles from entering the measurement cavity. However, said meshes may also allow environmental acoustic waves, like undesired noises from the surrounding environment, to enter the measurement cavity. Accordingly, acoustic crosstalk may result. Most of nowadays particle protecting methods are acoustically transparent and hence do not sufficiently suppress acoustic crosstalk to the sensor (or even pressure crosstalk). Some sensor concepts may comprise a so-called "bottom-port" configuration in which the actual MEMS microphone for detecting the pressure waves inside the measurement cavity is mounted directly opposite to the fluid inlet port. The membrane may comprise ventilation holes to let the fluid pass through the membrane into the measurement cavity. However, the microphone's membrane is sensitive to acoustic waves. Accordingly, in addition to the desired photoacoustic signal, the microphone membrane may also detect environmental noise, which may lead to acoustic crosstalk.

Thus, it would be desirable to provide a micromechanical device which is permeable to fluids so as to allow said fluids to enter the measurement chamber, and which prevents particles from the surrounding environment from entering the measurement chamber, while at the same time providing noise suppression in order to prevent acoustic crosstalk.

SUMMARY

Thus, according to the herein described innovative concept, a micromechanical device is provided comprising a membrane structure suspended on a substrate. The membrane structure may comprise a gas permeable membrane comprising a plurality of openings. The membrane structure may further comprise a reinforcement structure for stiffening the membrane and/or for increasing the mechanical stability of the membrane in order to attenuate an oscillation of the membrane.

BRIEF DESCRIPTION OF THE DRAWINGS

In the following, embodiments of the present disclosure are described in more detail with reference to the figures, in which FIGS. 3A-3C show microscopic images of a micromechanical device according to an embodiment and details of the perforated membrane structure, the mem-brane and the reinforcement structure according to an embodiment, FIGS. 4A-4D show schematic top views of details of the membrane structure, the perforated membrane and the reinforcement structure according to an embodiment, FIGS. 5A-5C show schematic top views of details of the perforated membrane and some exemplary geometrical shapes of the perforations according to an embodiment.

DETAILED DESCRIPTION OF ILLUSTRATIVE EMBODIMENTS

Figure 1:
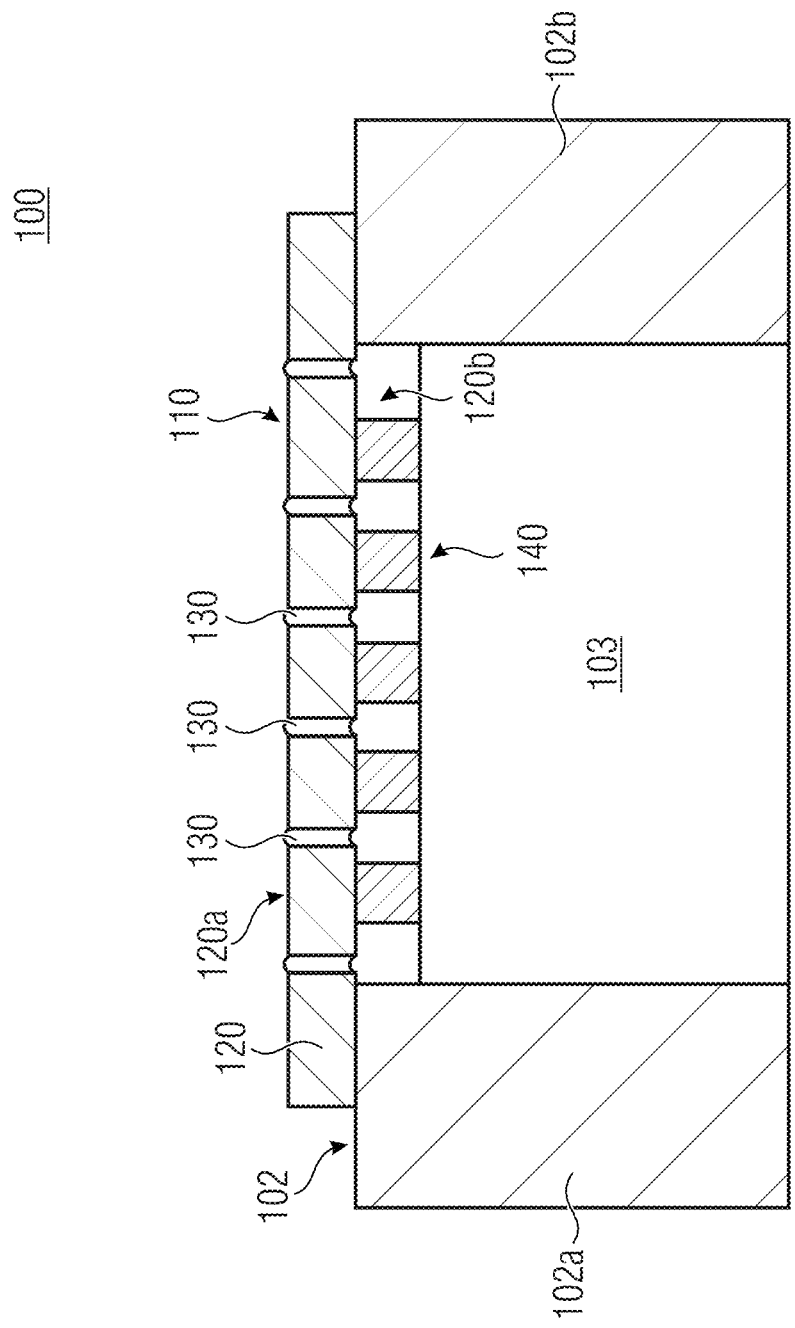
FIG. 1 shows a schematic cross-sectional view of a micromechanical device according to an embodiment.

Equal or equivalent elements or elements with equal or equivalent functionality are denoted in the following description by equal or equivalent reference numerals.

Method steps which are depicted by means of a block diagram and which are described with reference to said block diagram may also be executed in an order different from the depicted and/or described order. Furthermore, method steps concerning a particular feature of a device may be replaceable with said feature of said device, and the other way around.

Figure 2:
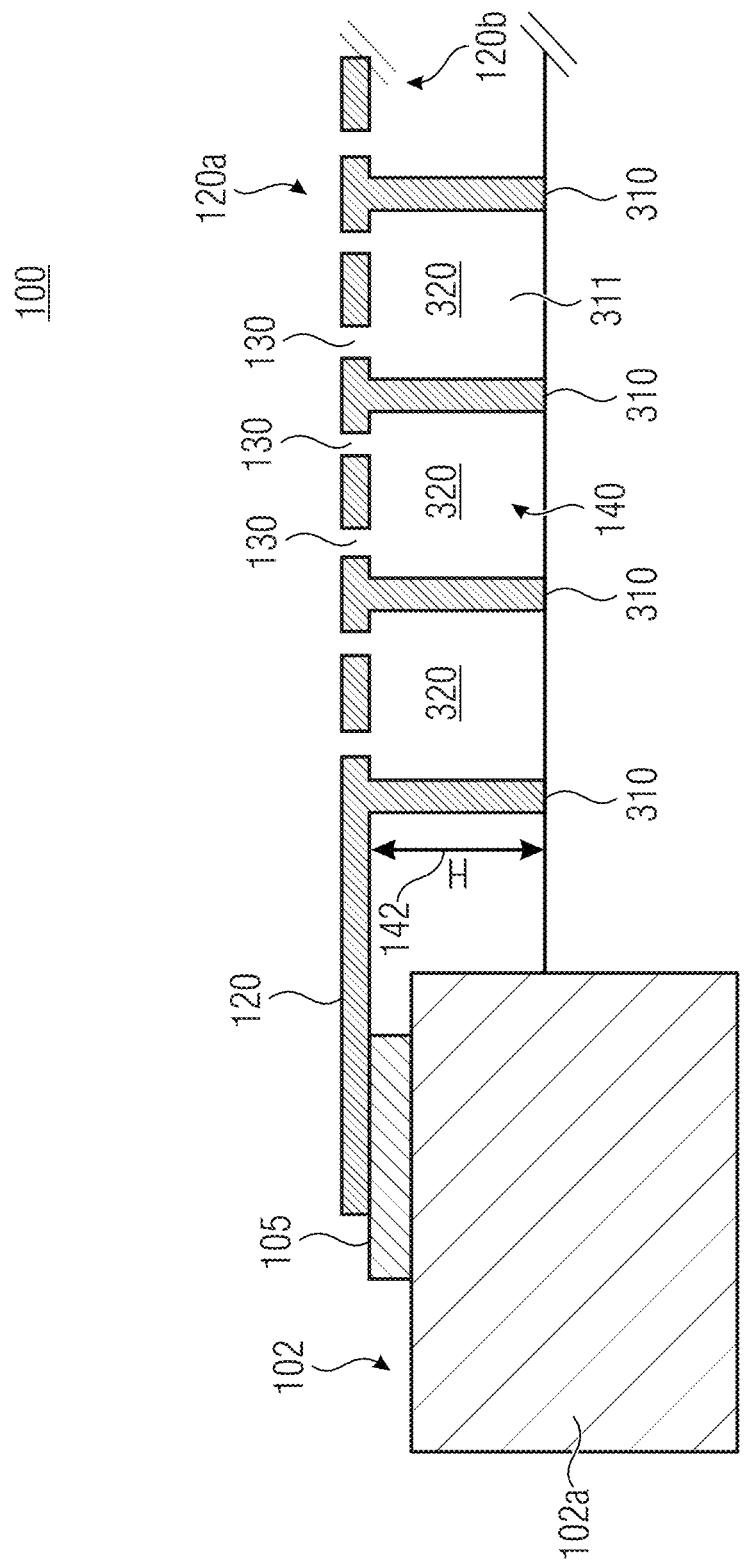
FIG. 2 shows a further schematic cross-sectional view of a micromechanical device according to an embodiment.

FIGS. 1 and 2 show a micromechanical device 100 according to an embodiment of the herein described innovative principle. The micromechanical device 100 may comprise a substrate 102. The substrate 102 may comprise a circumferential wall comprising circumferential vertical wall portions 102a, 102b leaving an opening or cavity 103 therebetween.

The micromechanical device 100 may comprise a membrane structure no. The membrane structure no may be arranged, e.g. mounted on, the substrate 102. For example, the membrane structure no may be suspended above said cavity 103 formed by the circumferential vertical wall portions 102a, 102b. In other words, the membrane structure no may be suspended on the substrate 102.

The membrane structure 110 may comprise a membrane 120. The membrane 120 may comprise a first (top) side 120a facing away from the substrate 102 and a second (bottom) side 120b facing towards the substrate 102. The membrane 120 may comprise a plurality of, e.g. at least two, openings 130. The openings 130 may penetrate through the membrane 120 in a vertical direction, e.g. perpendicular to the lateral extension of the membrane 120, i.e. between the first side 120a and the second side 120b of the membrane 120. Accordingly, each of the openings 130 may provide a fluid channel such that a fluid may pass through the membrane 120 making the membrane 120 permeable to fluids, and in particular permeable to gases. Thus, the openings 130 may also be referred to as perforations, and the membrane 120 may also be referred to as a perforated membrane 120.

Figure 8A:
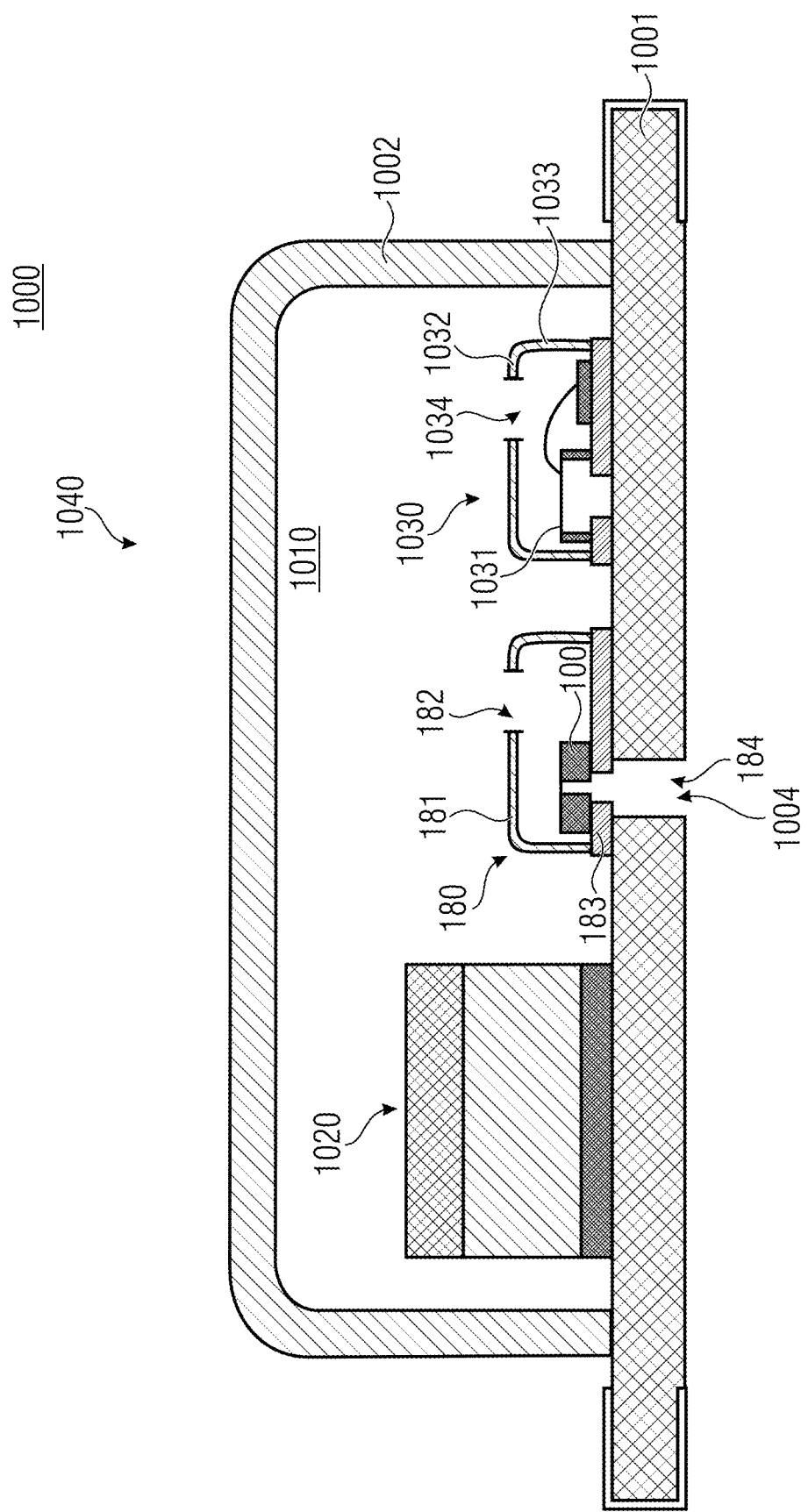
FIG. 8A shows a schematic cross-sectional view of a photoacoustic spectroscopy gas sensor in a bottom-port configuration comprising a micromechanical device according to an embodiment.
Figure 8B:
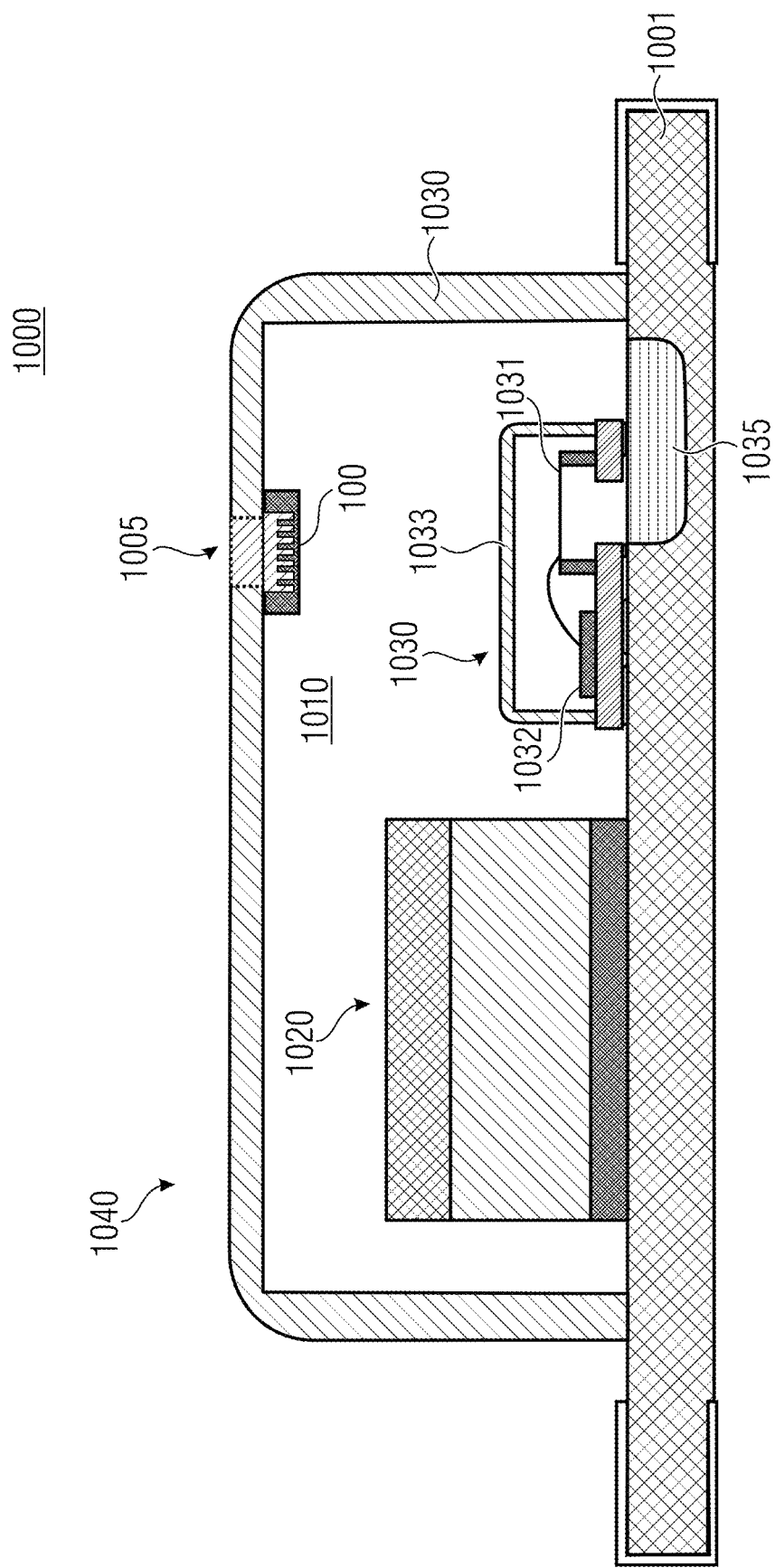
FIG. 8B shows a schematic cross-sectional view of a photoacoustic spectroscopy gas sensor in a top-port configuration comprising a micromechanical device according to an embodiment.

Generally, membranes may be excited by acoustic waves and may oscillate at respective frequencies. For example, membranes may be excited by acoustic waves originating from undesired environmental noise. If a conventional membrane was used in a photoacoustic spectroscopy gas sensor 1000 (c.f. FIGS. 8A and 8B), this would create undesired acoustic crosstalk inside the measurement cavity 1010. In order to attenuate this undesired acoustic crosstalk the membrane structure 110 according to the herein described innovative principle may comprise a reinforcement structure 140 being coupled with the perforated membrane 120. The reinforcement structure 140 may comprise a greater mechanical rigidity than the perforated membrane 120 itself. Thus, the reinforcement structure 140 may stiffen the perforated membrane 120 and/or increase the mechanical stability of the perforated membrane 120 in order to attenuate oscillations of the perforated membrane 120.

Thus, the perforated membrane 120 being coupled with the reinforcement structure 140 may tend to oscillate to a lesser extent than any membrane without said reinforcement structure 140. This is due to the fact that the reinforcement structure 140 may provide an increased mechanical stability to the perforated membrane 120 (compared to a membrane without said reinforcement structure 140) such that oscillations of the perforated membrane 120 are attenuated (compared to a membrane without said reinforcement structure 140).

The reinforcement structure 140 may be provided on the second side 120b of the perforated membrane 120, as exemplarily depicted in FIGS. 1 and 2. Additionally or alternatively, the reinforcement structure 140, or an additional further reinforcement structure, may be provided on the first side 120a of the perforated membrane 120 (not explicitly shown).

The micromechanical device 100 may serve multiple purposes. For example, the perforated membrane 120 may allow fluids, e.g. gases, to pass through the perforations 130 by means of diffusion. Accordingly, the micromechanical device 100 may provide for a ventilation structure to exchange gases and equalize environmental pressure for a given measurement volume.

Furthermore, the perforated membrane 120 may act as a fine mesh for preventing particles to pass through the perforations 130. For example, the plurality of perforations 130 provided in the membrane 120 may comprise a suitable dimension which allows the micromechanical device 100 to prevent environmental particles passing through the membrane structure 110, i.e. the membrane structure 110 may be used as particle protection.

Yet further, due to the rigid reinforcement structure 140, undesired oscillations of the membrane 120 are efficiently suppressed and/or attenuated, which efficiently prevents undesired acoustic crosstalk. For example, the innovative membrane structure 110, comprising the perforated membrane 120 being coupled with the reinforcement structure 140, may be used to adjust acoustic corner frequencies in order to attenuate oscillations of the perforated membrane 120 in predetermined frequency ranges. For example, the plurality of perforations 130 provided in the membrane 120 may comprise a suitable dimension which allows to fine-tune the diffusion speed as well as the acoustic attenuation.

For example, the number of perforations 130 in the perforated membrane 120 may be varied and/or the geometrical dimensions (e.g. the size) of the perforations 130 inside the perforated membrane 120 may be varied. For example, the diffusion time variable r depends on the perforation radius r according to:

$$\tau \alpha r^{-2}$$

and the noise attenuation factor S depends on the perforation radius r according to:

$$S \alpha r^{-4}.$$

As can be seen, the diffusion time variable r may be inversely proportional to the perforation radius r by the power of two, while the noise attenuation factor S may be inversely proportional to the perforation radius r by the power of four. Thus, the larger the dimensions of the perforations 130 the higher the diffusion but the lesser the noise attenuation. Thus, in designing the perforations 130 a tradeoff exists between providing a sufficient diffusion and providing an efficient noise attenuation. Thus, care should be taken in designing the number of perforations 130 and their geometrical dimensions.

As mentioned above, the geometrical dimensions (e.g. the size) and/or the number of perforations 130 in the perforated membrane 120 may be varied in order to fine-tune the diffusion speed as well as the acoustic attenuation.

According to some non-limiting examples, the plurality of perforations 130 may comprise a number of at least 250 perforations, or at least 1000 perforations, or at least 10000 perforations, or at least 30000 perforations being provided in the membrane 120. Additionally or alternatively, each one of the plurality of perforations 130 may have at least one lateral extension (e.g. a radius, a length or a width) in the range between 10 nm and 5 μm, or in the range between 10 nm and 2 μm, or in the range between 100 nm and 1 μm. An exemplary membrane structure 110 was designed which comprised 30000 perforations, each having a radius of 0.25 μm, which membrane structure no showed a very good result with respect to the above mentioned tradeoff between a sufficient amount of diffusion and an effective noise attenuation.

For example, noise attenuation at frequencies between 0.05 Hz and 1 kHz may be preferred. The membrane 120 may comprise a predetermined and relatively low mechanical rigidity or stiffness which may not be sufficient to attenuate the noise in the aforementioned frequency range. However, according to the herein described innovative principle, the mechanical rigidity or stiffness of the membrane 120 may be increased by means of the reinforcement structure 140. The reinforcement structure 140 being coupled to the perforated membrane 120 may comprise a higher mechanical stability and rigidity than the membrane 120 itself.

The membrane 120 and the reinforcement structure 140 may together form the membrane structure 110. The mechanical rigidity or stiffness of the membrane structure 110 may be defined by its lateral dimensions and the particular frequency range in which noise, i.e. acoustic waves, shall be suppressed or attenuated.

In other words, an oscillation of the membrane structure 110 may be defined by its stiffness and its lateral size. Therefore, defining the lateral size of the membrane structure 110 and a particular frequency range of acoustic waves to be attenuated is a way to define the stiffness of the membrane structure 110. Thus, according to a non-limiting example, a lateral extension (length and width) of the membrane structure 110 may be in the range between 200 µm and 2000 µm. The rigidity or stiffness of the membrane structure 110 in combination with its lateral extension are chosen so as to attenuate acoustic waves with a frequency above 0.05 Hz, or in a range between 0.05 Hz and 1 kHz.

In some non-limiting examples, the mechanical rigidity of the reinforcement structure 140 may be higher than the mechanical rigidity of the membrane 120 by a factor of at least two, or by a factor of at least 10, or even by a factor of 20 and more. In order to provide said mechanical rigidity, the reinforcement structure 140 may comprise a plurality of ridges or ribs.

As can be seen in FIGS. 3A, 3B and 3C, the reinforcement structure 140 may comprise a plurality of mutually crossing ribs 310, 311 forming a mesh. The mesh shaped reinforcement structure 140 may therefore also be referred to as a mesh structure 300 that may comprise a first plurality of ribs 310 (e.g. at least two ribs 310) being arranged in parallel and extending in a first direction. The mesh shaped reinforcement structure 140 may further comprise a second plurality of ribs 311 (e.g. at least two ribs 311) being arranged in parallel and extending in a second direction being different from the first direction.

For example, the first and second directions may be perpendicular relative to each other. Thus, as shown in the non-limiting example of FIGS. 3A-3C, the ribs 310, 311 may be arranged relatively to each other in a rectangular meshed pattern, and in particular in a square shaped meshed pattern. That is, the mesh shaped reinforcement structure 140 or mesh structure 300 may comprise a plurality of single meshes 320 which may also be referred to as mesh segments 320. These mesh segments 320 may be defined and laterally delimited by the ribs 310, 311. As can be best seen in the close-up in FIG. 3C, at least one, and preferably each one of the single mesh segments 320, may comprise at least one opening or perforation 130.

FIGS. 4A to 4D show a further non-limiting example of a mesh shaped reinforcement structure 140 or mesh structure 300 according to the herein described innovative principle. This mesh structure 300 may also comprise a plurality of square shaped mesh segments 320. The average mesh size X of the mesh structure 300, i.e. the lateral dimensions of the mesh segments 320, may be between 5 µm and 100 µm. In this example, the mesh segments 320 may comprise a square shape or an even rectangular shape. Thus, the horizontal and vertical measures may be identical. However, if the mesh segments 320 may comprise different geometrical shapes (e.g. an uneven rectangle), then the average mesh size X may be defined as the average between a longest rib portion (e.g. a length) and a shortest rib portion (e.g. a width) of one particular mesh segment 320.

In the non-limiting example shown in FIG. 4B, each mesh segment 320 may comprise exactly one perforation 130. In the non-limiting example shown in FIG. 4C, each mesh segment 320 may comprise exactly four perforations 130. In the non-limiting example shown in FIG. 4D, each mesh segment 320 may comprise exactly one perforation 130 having a larger diameter than in the example of FIG. 4B.

In these non-limiting examples, the plurality of perforations 130 may be regularly distributed over the plurality of mesh segments 320. In other words, in each mesh segment 320 of the mesh structure 300 the same number of perforations 130 may be provided. For example, each mesh segment 320 may comprise a number of at least 250 perforations, or at least 1000 perforations, or at least 10000 perforations, or at least 30000 perforations.

As mentioned above, in order to solve the tradeoff between sufficient diffusion and efficient noise suppression, not only the number of perforations 130 may be varied but also the geometrical shape of the perforations 130. FIGS. 5A, 5B and 5C show different examples of geometrical shapes of the perforations or openings 130.

In the non-limiting example shown in FIG. 5A, the perforations 130 may comprise a substantially circular geometrical shape. The perforations 130 inside adjacent mesh segments 320 may each comprise the same diameter or radius, as discussed above with reference to FIGS. 4B and 4D. Alternatively, as exemplarily depicted here in FIG. 5A, the perforations 130 inside adjacent mesh segments 320 may comprise different diameters or radii. The diameter of a perforation 130 may vary between a pinhole size (FIG. 5A, upper left corner) and a circle covering more than half of the membrane surface inside one mesh segment 320 (FIG. 5A, bottom right corner).

In the non-limiting example shown in FIG. 5B, the perforations or openings 130 may comprise the geometrical shape of a slit. This may be advantageous since a slit shape may allow more amount of fluid to pass through the membrane 120 (in the same time) compared to the pinholes of FIG. 5A.

In the non-limiting example shown in FIG. 5C, the perforations or openings 130 may comprise the shape of a flap. This may be particularly advantageous in case of transient pressure pulses which can be more effectively compensated with a flap structure which can be rapidly opened and closed. For example, the micromechanical device 100 may be operated in a handheld device, e.g. in a smart phone, which is carried indoors by a user. If a door is abruptly shut, this may create a transient pressure pulse which would highly deflect the membrane 120. However, the flap shaped perforations 130 inside the membrane 120 may quickly open for letting the pressure waves immediately pass.

In some examples, each one of the plurality of openings 130 may comprise at least one lateral extension 132 in the range between 10 nm and 5 µm, or in the range between 10 nm and 2 µm, or in the range between 100 nm and 1 µm. Said lateral extension 132 may, for instance, be a radius R in case of circular holes (FIG. 5A), or a length L in case of a slit (FIG. 5B) or a width W in case of a flap (FIG. 5C), etc.

Figure 6A:
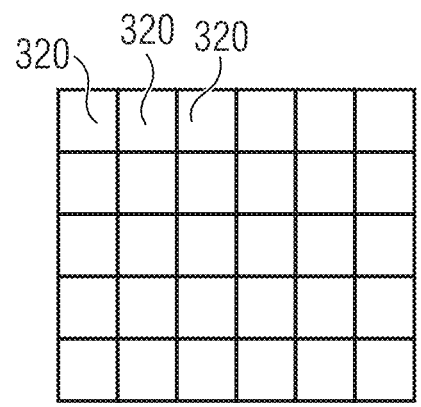
FIGS. 6A-6C show schematic top views of details of a mesh shaped membrane structure and some exemplary geometrical shapes of the single mesh segments according to an embodiment.
Figure 6B:
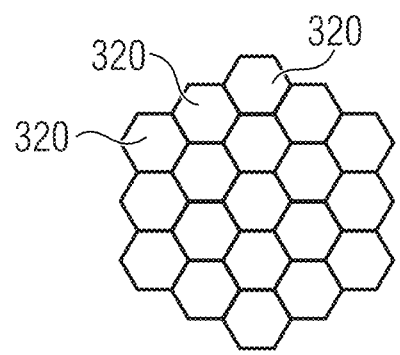
Figure 6C:
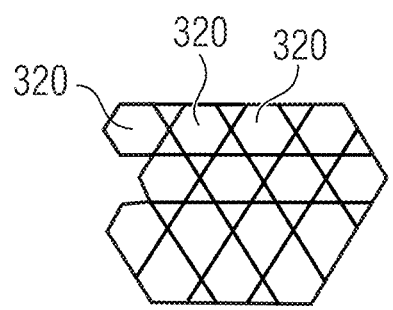

FIGS. 6A, 6B and 6C show some non-limiting examples of possible geometrical shapes of the mesh segments 320. FIG. 6A shows a square shaped formation of mesh segments 320, as previously discussed above. FIG. 6B shows a further non-limiting example, wherein the mesh segments 320 are arranged in a honeycomb structure which may provide more mechanical rigidity compared to the square shaped formation. FIG. 6C shows a further non-limiting example, wherein the mesh segments 320 comprise a hexagonal shape. In more general terms, the mesh segments 320 may be arranged in a hexagonal meshed pattern or, in more general terms, in either one of a periodic or aperiodic polygonal meshed pattern. Other geometrical shapes may be possible depending on the desired mechanical properties like mechanical rigidity or stiffness.

Returning to FIG. 2, one can see the first plurality of ribs 310 extending in a first direction and the second plurality of ribs 311 extending in the second direction. In this non-limiting example, only one rib 311 may be visible in this cross-sectional view, wherein said rib 311 may extend perpendicular to the first plurality of ribs 310. A desired number of mesh segments 320 may be formed between the ribs 310, 311.

As can further be seen in the non-limiting example of FIG. 2, the perforated membrane 120 may be bonded to the substrate 102, for example by means of an adhesive. Other suitable bonding materials may be possible. An optional insulating layer 105, e.g. a layer comprising or consisting of $SiO_2$, may be arranged between the substrate 102 and the perforated membrane 120. The perforated membrane 120 may comprise, or may consist of, at least one of silicon, silicon oxide and silicon nitride.

Still with reference to FIG. 2, the mechanical rigidity or stiffness of the ribs 310, 311 may further depend on its vertical height H. According to an example, the vertical height H of the ribs 310, 311 of the reinforcement structure 140 may be in the range between 2 m and 100 µm. In some non-limiting examples, like the one shown in FIG. 3B, the ribs 310, 311 may comprise a vertical height of 20 m f 20%. In more general terms, a dimension 142 of the reinforcement structure 140 perpendicular to the membrane 120 may be in the range between 2 µm and 100 µm.

FIGS. 7A to 7D show a non-limiting example of a method for producing the reinforcement structure 140 with the above mentioned exemplary dimensions.

Figure 7A:
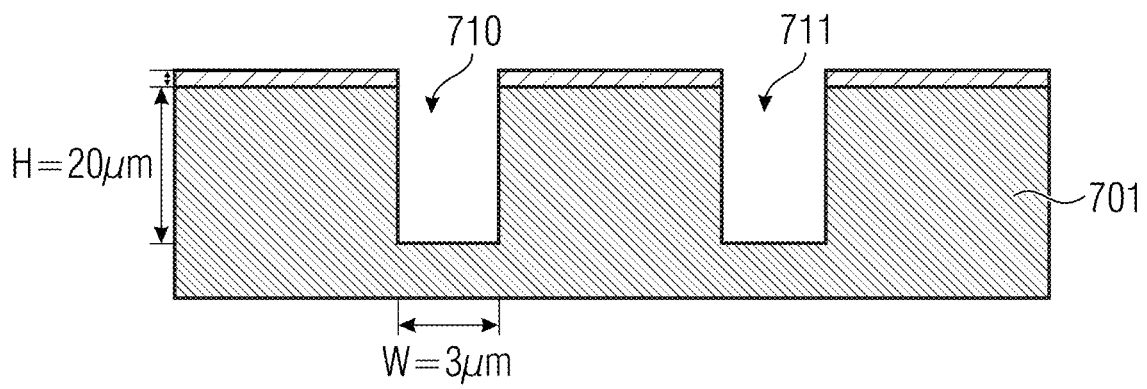
FIGS. 7A-7D show schematic cross-sectional views of an example of a method for producing a membrane structure comprising a perforated membrane and a reinforcement structure according to an embodiment.

In FIG. 7A a substrate 701 is provided. Trenches 710, 711 may be provided in the substrate 701, e.g. by means of etching, for instance DRIE etching. In this non-limiting example, the trenches 710, 711 may comprise a lateral width W of approximately 3 µm and a vertical height H of approximately 20 µm, which may correspond to an aspect ratio of approximately 7:1 (height to width). The trenches 710, 711 may have the approximate shape of the ribs 310, 311 of the reinforcement structure 140, as discussed above. Accordingly, the vertical height H of the trenches 710, 711 may be between 2 µm and 100 µm. The lateral width W of the trenches 710, 711 may be between 1 µm and 25 µm.

Figure 7B:
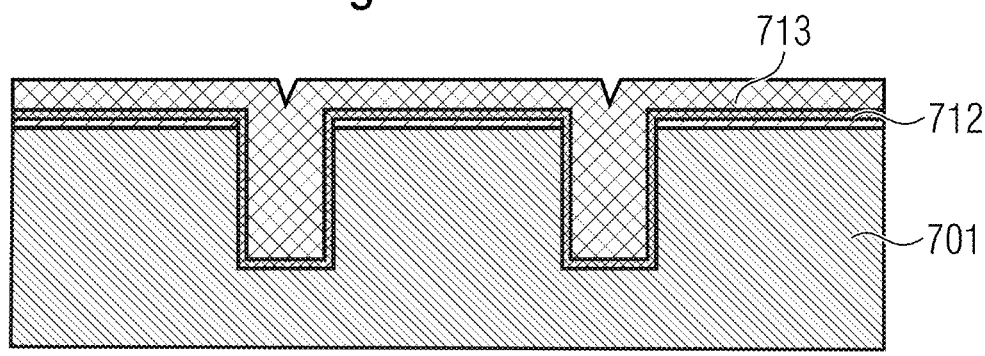

In FIG. 7B, a first layer 712, e.g. a passivation layer or etch stop layer or grind stop layer, may be deposited on the substrate 701 including the trenches 710, 711. A second layer 713 may then be deposited, preferably uniformly, onto the first layer 712. The second layer 713 may comprise, or may consist of, polysilicon. According to a non-limiting example, the substrate 701 may be removed afterwards such that the second layer 713 may remain and form the membrane structure 110. For example, those portions of the second layer 713 which were located inside the trenches 710, 711 may form the reinforcement structure 140, and in particular the ribs 310, 311 of the reinforcement structure 140. The laterally extending portion of the second layer 713 being deposited on the first layer 712 may form the membrane 120.

Figure 7C:
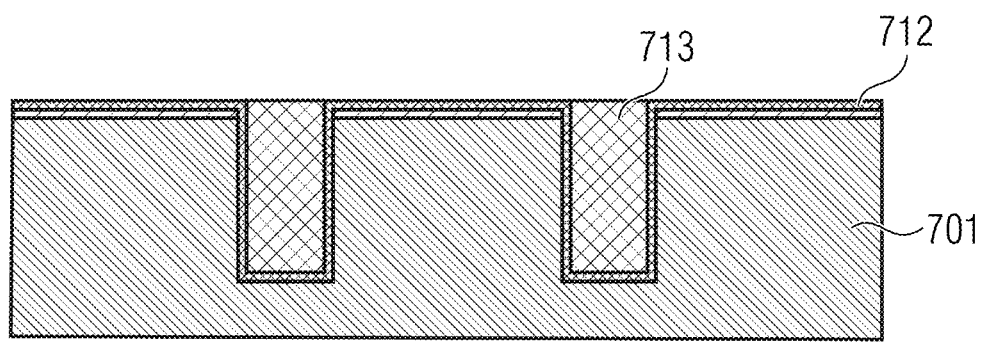

FIG. 7C shows an optional alternative step wherein the second layer 713 may be grinded or etched back until reaching the first layer 712 underneath the second layer 713 and to uncover or expose said first layer 712. Those portions of the second layer 713 being located inside the trenches 710, 711 may remain inside the trenches 710, 711.

Figure 7D:
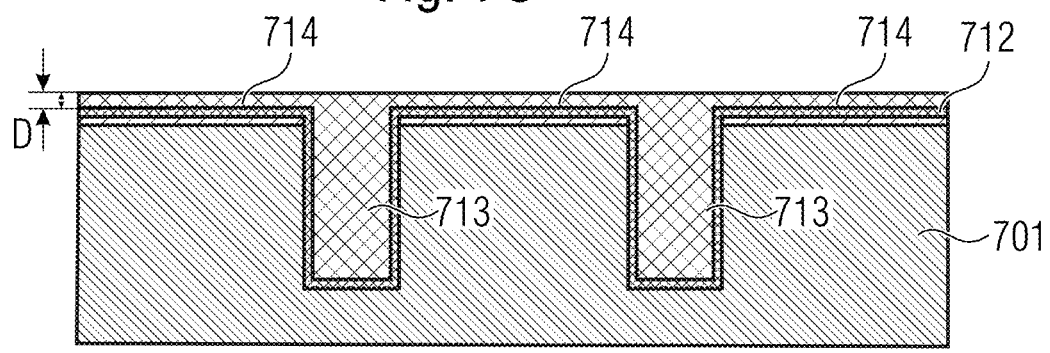

FIG. 7D shows a further optional alternative step wherein a third layer 714 may be deposited onto the exposed first layer 712 and onto the remaining portions of the second layer 713 inside the trenches 710, 711. The third layer 714 may comprise, or may consist of, polysilicon. The third layer 714 may comprise a thickness between 10 nm and 100 µm, or in the range between 100 nm and 10 µm, or in the range between 100 nm and 500 nm.

Afterwards, the substrate 701 may be removed. As a result, those portions of the second layer 713, which were located inside the trenches 710, 711, as well as the third layer 714, may remain as a self-supporting structure, forming the membrane structure 110. For example, those portions of the second layer 713 which were located inside the trenches 710, 711 may form the reinforcement structure 140 of the membrane structure 110, and in particular the ribs 310, 311 of the reinforcement structure 140, while the third layer 714 may form the membrane 120 of the membrane structure 110.

The third layer 714 and, thus, the membrane 120 may comprise a thickness D in a range between 10 nm and 100 µm, or in a range between 100 nm and 10 µm, or in a range between 100 nm and 500 nm. As discussed above, the membrane 120, e.g. the second and/or third layers 712, 714, may be perforated. The perforations 130 may be structured into the respective layer 712, 714 prior to or after removal of the substrate 701.

In the non-limiting example discussed above with reference to FIGS. 7A to 7D, the reinforcement structure 140 and the membrane 120 may be formed as one single piece. Alternatively, it may be possible that the reinforcement structure 140 and the membrane 120 may be structured separately as two separate pieces and be attached to one another afterwards.

FIGS. 8A and 8B show two non-limiting examples of a photoacoustic spectroscopy (PAS) gas sensor 1000 according to the herein described innovative principle. In this disclosure, the terms "photoacoustic spectroscopy gas sensor", "PAS gas sensor", and "photoacoustic sensor" may be used in an interchangeable manner.

In FIG. 8A, the PAS gas sensor 1000 may be packaged in a package 1040. The package 1040 may comprise a substrate 1001 and a protective cover or package lid 1002 being arranged on the substrate 1001. The inside of the package lid 1002 may provide a measurement cavity 1010 in which at least one target gas may reside. The substrate 1001 may, for instance be a laminated component board, e.g. a Printed Circuit Board (PCB). The substrate 1001 may comprise a fluid port opening 1004 through which fluid, e.g. gases, from the surrounding environment may flow into the measurement cavity 1010. Therefore, by analogy to so-called "bottom-port" MEMS microphones, this configuration may also be referred to as a "bottom-port" configuration.

The PAS gas sensor 1000 may further comprise a light emitter 1020 configured to emit light into the measurement cavity 1010. The emitted light may, for instance, be infrared light, and in particular pulsed light, e.g. pulsed infrared light.

The PAS gas sensor 1000 may further comprise an acoustic transducer 1030. The acoustic transducer 1030 may comprise a microphone 1031, in particular a MEMS microphone, comprising a membrane, configured to detect an acoustic signal induced by the emitted light according to the photoacoustic principle. Therefore, the acoustic transducer 1030 may comprise an integrated circuit 1032, e.g. an application-specific integrated circuit or ASIC. The microphone 1031 may be protected by a protective cover or lid 1033, which can have a lid opening 1034 so that the acoustic transducer 1030 is open to the measurement cavity 1010.

The PAS gas sensor 1000 may further comprise at least one micromechanical device 100 as described herein. Accordingly, the micromechanical device 100 may be provided in the PAS gas sensor 1000 in addition to the acoustic transducer 1030.

As exemplarily shown in FIG. 8A, the micromechanical device 100 may comprise a housing 180 in which the micromechanical device 100 is housed. The housing 180 may comprise a protective cover or housing lid 181 and a lid opening 182. The micromechanical device 100 and the housing lid 181 may be arranged on a substrate 183 (e.g. a PCB) such that the micromechanical device 100 is surrounded by the housing lid 181. Accordingly, the micromechanical device 100 may be provided as an assembly with a sensor module lid as a single part.

The substrate 183 may comprise a fluid port opening 184 through which fluid, e.g. gases, from the surrounding environment may flow into the cavity provided by the housing lid 181, and then through the lid opening 182 into the measurement chamber 1010. The fluid port opening 184 of the substrate 183 may be positioned opposite or adjacent to the above mentioned fluid port opening 1004 provided in the component board substrate 1001 of the package of the PAS gas sensor 1000.

Accordingly, the fluid port opening 1004 provided in the component board substrate 1001 and the fluid port opening 184 provided in the substrate 183 may together provide a common fluid port through which fluid, e.g. gases, from the surrounding environment may flow or diffuse, thereby entering the measurement cavity 1010.

The micromechanical device 100 may be positioned on the substrate 183 opposite or adjacent to the fluid port opening 184 and, thus, opposite or adjacent to the common fluid port defined by the fluid port openings 184 and 1004. The substrate 183 and its fluid port opening 184 may be optional. For example, the micromechanical device 100 may alternatively be provided as an unhoused bare die.

The micromechanical device 100 may be positioned opposite or adjacent to at least the fluid port opening 1004 of the component board substrate 1001 such that the fluid port opening 1004 is covered by the membrane structure 110 of the micromechanical device 100. Thus, before entering the measurement chamber 1010, the fluid passes the micromechanical device 100, and in particular the membrane structure 110. The micromechanical device 100 may therefore also be referred to as a diffusor.

As described above, the micromechanical device 100 may serve the dual purpose of preventing particles from entering the measurement chamber 1010 and of providing a noise blockade, i.e. preventing undesired environmental noise in the form of acoustic waves from entering the measurement chamber 1010. Since the reinforcement structure 140 stiffens (i.e. increases the rigidity of) the membrane 120 of the membrane structure 110 of the micromechanical device 100, oscillations of the membrane 120 induced by environmental noise are effectively attenuated.

Thus, undesired environmental noise and other acoustic waves from the surrounding environment are effectively suppressed and prevented from entering the measurement chamber 1010 by means of the micromechanical device 100. Therefore, the acoustic transducer 1030 inside the measurement cavity 1010 may not be disturbed by any undesired acoustic waves which may not originate from the target gas according to the photoacoustic principle. Thus, the photoacoustic spectroscopy (PAS) gas sensor 1000 shows a very good signal-to-noise ratio and a very high sensitivity.

As can be seen in the FIGS. 8A and 8B, the micromechanical device 100 may comprise a similar construction to that of the acoustic transducer 1030 (e.g. similar to a silicon microphone). For example, the membranes and the substrates may be similar or identical. Furthermore, the package of the micromechanical device 100 (comprising the substrate 183 and the package lid 181) may be similar or identical to the package of the acoustic transducer 1030. The micromechanical device 100 may be produced at least partly in the same production line as the acoustic transducer 1030, which may significantly reduce production costs.

However, in comparison with the acoustic transducer 1030, the micromechanical device 100 comprises the above discussed additional reinforcement structure 140 in order to stiffen the membrane 120 and for increasing the mechanical stability of the membrane 120 in order to attenuate an oscillation of the membrane 120.

FIG. 8B shows a further embodiment of a PAS gas sensor 1000 which is similar to the embodiment described above with reference to FIG. 8A. Thus, only the differences shall be discussed.

As in the example above, the PAS gas sensor 1000 may be packaged in a package 1040 comprising a component board substrate 1001 and a package lid 1002 arranged on said substrate 1001. However, the component board substrate 1001 may be free from, i.e. may not comprise any, fluid ports 1004.

The package lid 1002 may comprise a fluid port opening 1005 through which fluid, e.g. gases, from the surrounding environment may flow into the measurement cavity 1010. Therefore, by analogy to so-called "top-port" MEMS microphones, this configuration may also be referred to as a "top-port" configuration. The micromechanical device 100 may be arranged opposite or adjacent to said fluid port opening 1005 such that the fluid port opening 1005 may be covered by the membrane structure 110 of the micromechanical device 100. Thus, before entering the measurement chamber 1010, the fluid passes the micromechanical device 100, and in particular the membrane structure 110.

As described above, the micromechanical device 100 may serve the dual purpose of preventing particles from entering the measurement chamber 1010 and of providing a noise blockade, i.e. preventing undesired environmental noise in the form of acoustic waves from entering the measurement chamber 1010. Since the reinforcement structure 140 stiffens the membrane 120 of the membrane structure 110 of the micromechanical device 100, oscillations of the membrane 120 induced by environmental noise are effectively attenuated.

In the embodiment, which is exemplarily depicted in FIG. 8B, the micromechanical device 100 is provided as an unhoused bare die. In other words, the micromechanical device 100 (diffusor) may be included in the PAS gas sensor 1000, and being assembled as a bare die.

However, according to some non-limiting examples, the housed micromechanical device 100 as described with reference to FIG. 8A may be provided in the embodiment of FIG. 8B, and vice versa. Additionally or alternatively, one or more electromechanical devices 100 (housed and/or unhoused) may be comprised by a PAS gas sensor 1000.

Furthermore, as illustrated in FIG. 8B, rather than having a lid opening 1034 in the protective cover or lid 1033 (c.f. FIG. 8A), the acoustic transducer 1030 may be open to the measurement cavity 1010 via a trench 1035 provided in the substrate 1001.

Accordingly, in some embodiments the PAS gas sensor 1000 may be provided in an overall "bottom-port" configuration, as illustrated in FIG. 8A, or in an overall "top-port" configuration, as illustrated in FIG. 8B. This choice does not have to be limiting for the configuration of the acoustic transducer 1030.

Therefore, in some embodiments, the acoustic transducer 1030 may also be provided in a "top-port" configuration, as illustrated in FIG. 8A, or in a "bottom-port" configuration, as illustrated in FIG. 8B. Both configurations of the acoustic transducer 1030 may be compatible with either overall top or bottom port configuration of the PAS gas sensor 1000.

Figure 9:
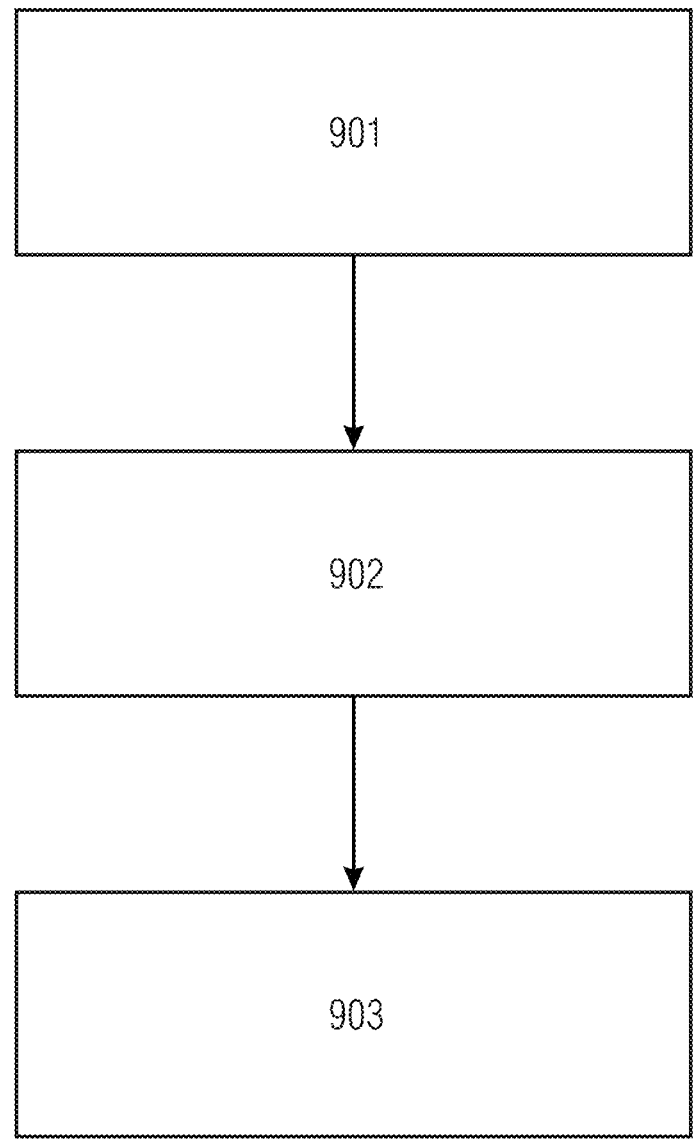
FIG. 9 shows a schematic block diagram of a method for manufacturing a micromechanical device according to an embodiment.

FIG. 9 shows a non-limiting example of a method for manufacturing a micromechanical device 100, as described herein.

In step 901 a membrane 120 is provided. In step 902 a plurality of openings 130 is structured into the membrane 120 for making the membrane 120 permeable to gas. In step 903 a reinforcement structure 140 is provided, the reinforcement structure 140 being connected to the membrane 120 for stiffening the membrane 120 and/or for increasing the mechanical stability of the membrane 120 in order to attenuate an oscillation of the membrane 120. The reinforcement structure 140 may be connected to the membrane 120, by e.g. being attached to the membrane 120 or by being formed as a single-piece together with the membrane 120, as previously discussed above with reference to FIGS. 7A to 7D.

The herein described innovative concept shall be briefly summarized in an alternative wording in the following. Some non-limiting examples and embodiments may provide a rigid ventilation structure 100 for particle protection and gas diffusion. Some non-limiting examples and embodiments may provide a micromechanical device 100 which may be constructed as a (passive) MEMS chip with a thin perforated membrane 120. For acoustic noise suppression the membrane 120 may be designed as a rigid structure, e.g. by means of the innovative reinforcement structure 140. Said rigid structure of the membrane 120 may allow for a defined acoustic suppression and particle protection. Furthermore, it provides a gas permeable design for enhanced media exchange due to diffusion. The micromechanical device 100 may comprise similar properties as a porous material. However, it can be optimized towards diffusion speed, acoustic attenuation and is at the same time much thinner and smaller as conventional porous materials.

The perforated membrane 120 may be designed as a perforated thin MEMS membrane supported by ridges or ribs 310, 311 to enhance mechanical stability. The perforation density (i.e. the number of perforations 130) may be used to fine-tune the diffusion speed as well as the acoustic attenuation.

The micromechanical device 100 may be a sub part (component) of a bigger system, e.g. of a Photo Acoustic Spectroscopy sensor (PAS sensor 1000) or of a non-dispersive infrared (NDIR) sensor. It could be also a discrete or separate product acting as at least one of a particle protection, a diffusion barrier or diffusion layer and a pressure ventilation adjustment structure. The micromechanical device 100 may be a passive structure, i.e. without any electronic circuits.

Accordingly, the micromechanical device 100 according to the herein described innovative principle is a multi-purpose device that may provide at least one of the following advantages:
- a thin acoustic suppressing structure for fluids (or gases) consisting of thin fluidic channels to realize a material exchange with at the same time high acoustic attenuation;
- a particle barrier with acoustic low pass behavior and improved fluid diffusion;
- a thin membrane structure with ridges for mechanical stability and holes, slits or slits forming flaps for ventilation;
- it comprises a small and thin form factor;
- it provides more defined diffusion speed as conventional meshes;
- it provides a better acoustic suppression as conventional meshes;
- it may be provided as a possible standalone product (e.g. as particle protection).

These advantageous features may be provided by suitably adjusting at least one of:
- the amount and size of the perforations 130 which may affect the acoustic and diffusion properties
- the geometrical shape and structure of the perforations 130 which may affect the acoustics and diffusion properties and which may account for transient pressure pulses (e.g. flaps)
- the geometrical shape and structure of the ribs 310, 311 which may effect the mechanical properties like rigidity of the reinforcement structure 140.

Furthermore, the perforations 130 will make the perforated membrane 120 permeable to fluids, e.g. to gases, allowing the micromechanical device 100 to let fluids, e.g. gases, pass through the membrane structure 110. Any fluid acting on the membrane structure 110 when passing through the membrane 120 may deflect the membrane 120 to a certain extent causing the membrane 120 to oscillate. Furthermore, environmental acoustic waves (e.g. external environmental noises) may impinge on the membrane structure 110 causing the membrane 120 to oscillate at the respective frequencies.

These oscillations would be forwarded by the oscillating membrane 120 as undesired pressure waves (i.e. noise) into the measurement cavity 1010 (c.f. FIGS. 8A and 8B) in case the micromechanical device 100 was used in a PAS gas sensor 1000. However, according to the herein described innovative principle, the reinforcement structure 140 attenuates these undesired oscillations of the membrane 120 leading to an effective suppression of the undesired pressure waves.

Summarizing, the micromechanical device 100 may advantageously act as a mesh and at the same time as an acoustic noise suppression means. A conventional mesh may let pass a sufficient amount of fluid and it prevents larger particles from passing. However, a mesh may not sufficiently suppress undesired environmental noise since the acoustic waves may pass the mesh without any substantial resistance. A conventional perforated membrane, in turn, may also allow to let pass a certain amount (but compared to a mesh, a reduced amount) of fluid. However, a conventional membrane is excited by the environmental noise and oscillates at the respective frequencies. The micromechanical device 100 according to the herein described principle allows to let pass a sufficient amount of fluid and at the same time to efficiently suppress environmental noise since its membrane structure 110 is much more rigid compared to a conventional membrane.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

While this disclosure has been described with reference to illustrative embodiments, this description is not intended to be construed in a limiting sense. Various modifications and combinations of the illustrative embodiments, as well as other embodiments of this disclosure, will be apparent to persons skilled in the art upon reference to the description. It is therefore intended that the appended claims encompass any such modifications or embodiments.

What is claimed is:

1. A micromechanical device comprising:
    a membrane structure suspended on a substrate;
        a perforated gas permeable membrane, included with the membrane structure, and comprising a plurality of perforations; and
        a reinforcement structure, included with the membrane structure, and coupled with the perforated gas permeable membrane for at least one of stiffening the perforated gas permeable membrane or increasing mechanical stability of the perforated gas permeable membrane, in order to attenuate an oscillation of the perforated gas permeable membrane, wherein the reinforcement structure forms a mesh structure that is different from the perforated gas permeable membrane.

2. The micromechanical device according to claim 1,
    wherein the reinforcement structure comprises a plurality of mutually crossing ribs or ridges; and
    wherein the ribs or ridges are arranged in at least one of:
        a rectangular meshed pattern, a hexagonal meshed pattern, a periodic polygonal meshed pattern, or an aperiodic polygonal meshed pattern.

3. The micromechanical device according to claim 1, wherein an average mesh size of the mesh structure is between about 5 μm and 100 μm.

4. The micromechanical device according to claim 1, wherein the mesh structure comprises a plurality of mesh segments, and wherein the plurality of perforations is regularly distributed over the plurality of mesh segments.

5. The micromechanical device according to claim 1, wherein the plurality of perforations comprises a number of at least 250 perforations, or at least 1000 perforations, or at least 10000 perforations, or at least 30000 perforations being provided in the perforated gas permeable membrane.

6. The micromechanical device according to claim 1, wherein each one of the plurality of perforations of the perforated gas permeable membrane has at least one lateral extension between about 10 nm and 5 μm, or between about 10 nm and 2 μm, or between about 100 nm and 1 μm.

7. The micromechanical device according to claim 1, wherein a dimension of the reinforcement structure perpendicular to the perforated gas permeable membrane is between 2 μm and 100 μm.

8. The micromechanical device according to claim 1, further comprising:
    a lateral extension of the membrane structure is between 200 m and 2000 μm, wherein a stiffness of the membrane structure, in combination with the lateral extension of the membrane structure, enables attenuating acoustic waves with a frequency above 0.05 Hz, or in a frequency range between 0.05 Hz and 1 kHz.

9. The micromechanical device according to claim 1, wherein the perforated gas permeable membrane has a thickness between about 10 nm and 100 μm, or between about 100 nm and 10 μm, or between about 100 nm and 500 nm.

10. The micromechanical device according to claim 1, wherein the reinforcement structure is attached to the perforated gas permeable membrane, or wherein the reinforcement structure is formed as a single-piece together with the perforated gas permeable membrane.

11. The micromechanical device according to claim 1, wherein the perforated gas permeable membrane comprises a solid state material including at least one of silicon, silicon nitride, or silicon oxide.

12. A gas sensor comprising:
    a micromechanical device comprising a membrane structure suspended on a substrate;
    a measurement cavity;
    a light emitter configured to emit light into the measurement cavity; and
    an acoustic transducer configured to detect an acoustic signal induced by the emitted light according to the photoacoustic principle,
wherein the membrane structure further comprises:
    a perforated gas permeable membrane comprising a plurality of perforations; and
    a reinforcement structure coupled with the perforated gas permeable membrane for at least one of stiffening the perforated gas permeable membrane or increasing mechanical stability of the perforated gas permeable membrane, wherein the reinforcement structure forms a mesh structure that is different from the perforated gas permeable gas permeable membrane.

13. The gas sensor according to claim 12, further comprising:
    a package for the gas sensor comprising a package lid; and
    a fluid port in the package lid,
    wherein the micromechanical device is positioned adjacent to fluid port such that the fluid port is covered by the membrane structure.

14. The gas sensor according to claim 12, further comprising:
    a component board substrate on which the gas sensor is located; and
    a fluid port in the component board substrate, and
    wherein the micromechanical device is positioned adjacent to the fluid port such that the fluid port is covered by the membrane structure.

15. The gas sensor according to claim 12,
    wherein the mesh structure comprises a plurality of mutually crossing ribs or ridges; and
    wherein the ribs or ridges are arranged in at least one of:
        a rectangular meshed pattern, a hexagonal meshed pattern, a periodic polygonal meshed pattern, or an aperiodic polygonal meshed pattern.

16. The gas sensor according to claim 12, wherein the mesh structure comprises a plurality of mesh segments, and wherein the plurality of perforations is regularly distributed over the plurality of mesh segments.

17. The gas sensor according to claim 12, wherein the reinforcement structure is attached to the perforated gas permeable membrane, or wherein the reinforcement structure is formed as a single-piece together with the perforated gas permeable membrane.

18. The gas sensor according to claim 12, wherein the perforated gas permeable membrane comprises a solid state material including at least one of silicon, silicon nitride, or silicon oxide.

19. The gas sensor according to claim 12, wherein the reinforcement structure is configured to attenuate an oscillation of the perforated gas permeable membrane.

20. A method for manufacturing micromechanical devices, the method comprising:
- providing a micromechanical device having a membrane structure suspended on a substrate;
- providing, in the membrane structure, a perforated membrane having a plurality of perforations permeable to a gas;
- providing, in the membrane structure, a reinforcement structure coupled to the perforated membrane for at least one of stiffening the perforated membrane or increasing a mechanical stability of the perforated membrane in order to attenuate an oscillation of the perforated membrane, wherein the reinforcement structure forms a mesh structure that is different from the perforated membrane.

* * * * *